United States Patent
Brownstein

(10) Patent No.: US 6,424,138 B1
(45) Date of Patent: Jul. 23, 2002

(54) SPECTRUM ANALYZER UTILIZING A DISCONTINUOUS SIGNAL RECORD

(75) Inventor: Herman Brownstein, Nashua, NH (US)

(73) Assignee: BAE SYSTEMS Information and Electronic Systems Integrations, Inc., Nashua, NH (US)

( * ) Notice: Subject to any disclaimer, the term of this patent is extended or adjusted under 35 U.S.C. 154(b) by 0 days.

(21) Appl. No.: 05/742,952

(22) Filed: Nov. 15, 1976

(51) Int. Cl.[7] ................................................ G01R 13/14
(52) U.S. Cl. ................... 324/76.24; 324/76.33; 342/192
(58) Field of Search .............................. 324/77 B, 77 C, 324/77 CS, 77 G, 77 H, 76.24, 76.33; 343/100 CL; 364/604; 342/192

(56) References Cited

U.S. PATENT DOCUMENTS 3,529,142 A * 9/1970 Robertson .................. 324/77 G

* cited by examiner

Primary Examiner—Theodore M. Blum
(74) Attorney, Agent, or Firm—Daniel J. Long

(57) ABSTRACT

A high resolution cross correlation, coherent integration type spectrum analyzer for use in obtaining detailed spectral signatures of subsurface and surface vessels correlates short discontinuous records of the incoming signal with reference signals of known frequencies and accumulates the results to establish cross correlation over a relatively long total record made up of the short discontinuous record segments, with the long combined record being responsible for the high resolution of the system. The discontinuous record is processed so that the results duplicate correlation over a long continuous record by measuring the length of the input signal lost due to the discontinuity between adjacent first and second records and by adjusting the starting phase of the reference signal applied to the correlator at the start of the second record in accordance with the length of input signal lost and in accordance with the particular reference frequency employed in the correlation, so that the reference signal starts out in phase with that portion of the input signal that would be expected to exist at the end of the discontinuity between the records were there no discontinuity.

15 Claims, 7 Drawing Sheets

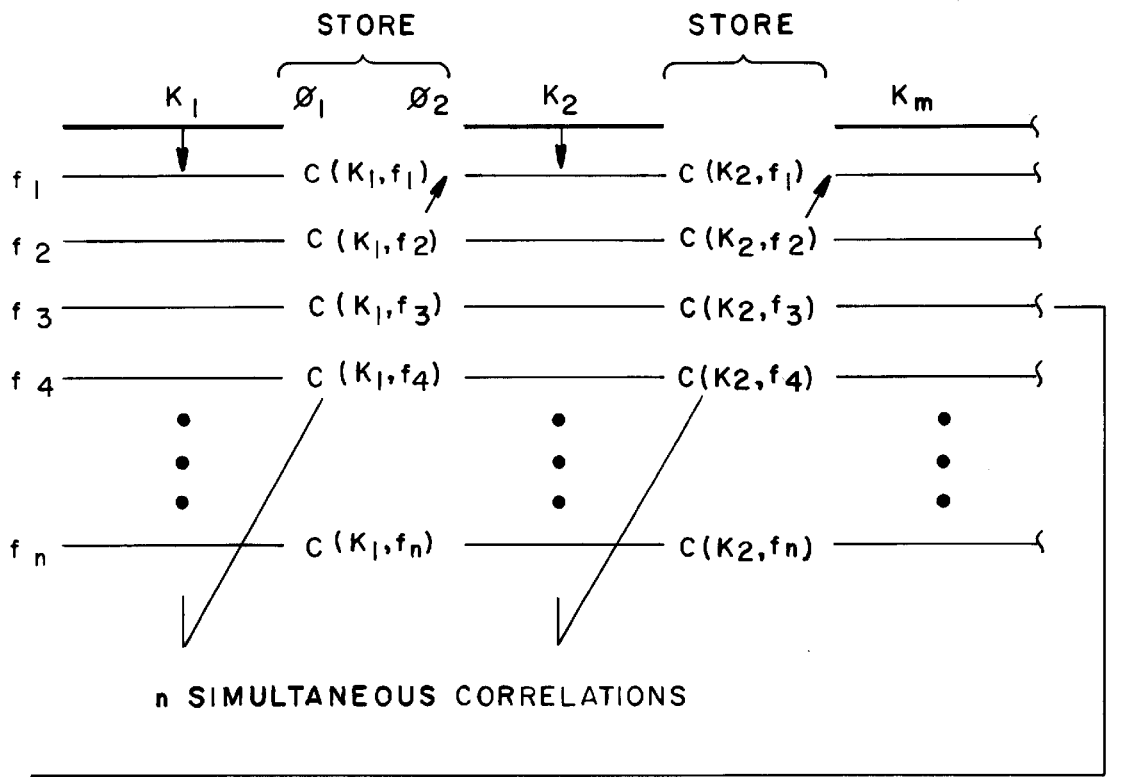
n SIMULTANEOUS CORRELATIONS
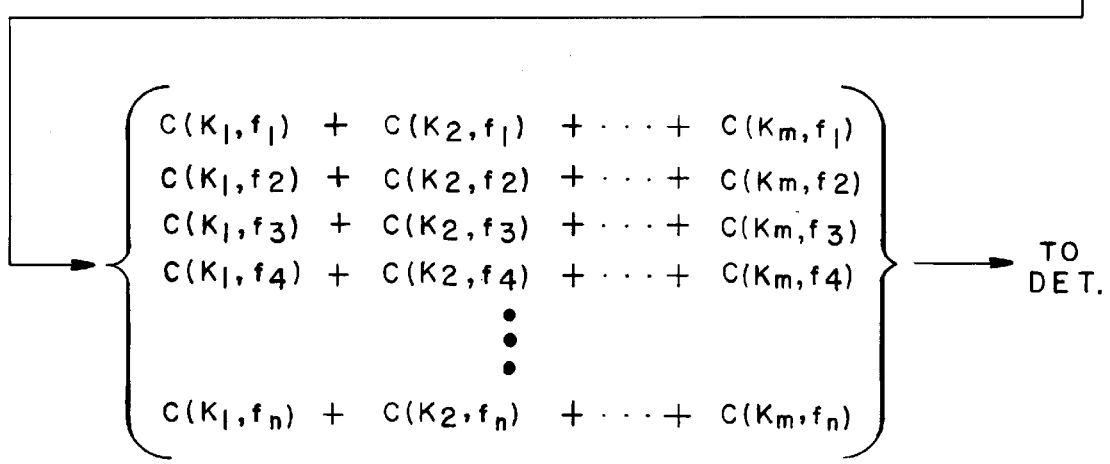
m SIMULTANEOUS ACCUMULATIONS
FIG. 11.

SPECTRUM ANALYZER UTILIZING A DISCONTINUOUS SIGNAL RECORD

FIELD OF THE INVENTION

This invention relates to spectral analysis and more particularly to a high resolution spectrum analyzer for use in anti-submarine warfare applications.

BACKGROUND OF THE INVENTION

One of the most pressing problems in anti-submarine warfare (ASW) applications is the detection of the spectral signature, direction and velocity of both surface and subsurface vessels by either passive or active listening devices located at sonobuoys which are air dropped across a given area suspected of having enemy vessels.

The purpose of the passive sonobuoys is to listen for subsurface or surface activity and transmit detected signals, usually in the acoustic range, to overflying aircraft. The system to be described is useable with both LOFAR and DIFAR buoys in which the LOFAR buoy is an omnidirectional listening type buoy and the DIFAR buoy includes direction determining apparatus so as to be able to locate the direction of the incoming signals.

The signals from the sonobuoys are, in general, transmitted to the overflying aircraft which identifies the particular sonobuoy from which a signal is coming, its position, and the information carried on the signal. The incoming signals from the sonobuoys are usually analyzed in detail as to the particular signature of the sound source. This includes analysis as to the particular frequencies which are present in the incoming signal, usually in a range from 2.5 Hz to 3,000 Hz; any doppler shift of the spectral lines of the signal; the line width of the spectra so as to identify whether the particular vessel is driven by an internal combustion engine (broad spectral line) or by turbine or electric power (narrow spectral line); the amplitude of each of the spectra of the signal; and the direction of the particular incoming signal, so as to identify the source of either continuous signals or periodic signals indicative of known types of vessels.

In a typical passive listening system, the signals from the sonobuoy are sampled and digitized so as to produce a digital representation of the incoming signal. In order to perform a spectrum, analysis, the digital representation of the incoming signal is multiplied with a digital representation of a reference signal of a predetermined frequency, with the product thereof being integrated to obtain the degree of correlation between the reference signal and the incoming signal. The reference signal is periodically changed or stepped in a known and rapid fashion so that the incoming sampled signal is compared with a large number of reference signals, each at a different frequency. When correlation occurs, the reference frequency is noted as well as the amplitude of the signal. The notation is usually in the form of a "gram" type display which gives a time history of the frequency and amplitude of the incoming signal. From this type display, spectral signature information as well as any doppler frequency shift indicating a relative velocity with respect to the particular sonobuoy can be readily observed. The same type information can be obtained from a so-called "waterfall" display or even from the traditional display of the spectra of the incoming in terms of frequency versus amplitude.

The system described utilizes a narrow band digital filter, the center frequency of which is rapidly stepped so that a spectral analysis over a range of frequencies takes place in real time. The system differs generically from Fast Fourier Transform (FFT) analysis as follows: FFT analysis reduces the number of operations to be carried out in performing a spectral analysis while at the same time accepting whatever complexity is involved for the individual operations. The narrow band digital filter reduces the complexity of the individual operations while accepting whatever number of operations naturally arises.

This process is equivalent to passing the signal through a narrow band filter whose band width is equal to the reciprocal of the time epoch over which the cross correlation is performed. By storing a sequence of digitized signal samples (which we call a "record") in an electronic memory, the samples may be sequenced through the cross correlator at many times the real-time rate. Each time the sequence is recirculated, the reference frequency is stepped to a different frequency thereby accomplishing real time spectrum analysis.

One of the problems with prior ASW spectrum analyzers has been the sensitivity of the spectrum analysis, especially at the relatively low acoustic frequencies which typify the types of radiation from a moving target vessel such as a submarine. The sensitivity of the spectrum analyzer in general is directly proportional to the length of the record of the incoming signals which is processed. The longer the record the better able will be the apparatus to resolve stable signals by virtue of long integration times. Moreover, in terms of bandwidth (BW), bandwidth is inversely proportional to the length of a record processed in a coherent fashion. This means that the longer the coherent record processed the narrower the bandwidth and the greater, the resolution.

The criticality of the resolution of a given spectrum analyzer for use in ASW applications can be seen in a comparison between prior art systems and the present system. It is a feature of the prior art systems that prior art apparatus do not detect doppler shifts of under 2.5 Hz at 1,000 Hz. This doppler shift corresponds to a velocity of the source relative to the sonobuoy of 7.4 knots. Thus, present day apparatus does not detect movement of targets which are proceeding at a speed of under 7.4 knots. This is because in general, present spectrum analyzers utilized in ASW applications have a resolution of $\pm\frac{1}{4}\%$ of the reference frequency. On the other hand, the subject system to be described permits resolution of $\pm\frac{1}{64}\%$ of the reference frequency. This results in a resolution at 1,000 Hz. of 0.156 Hz which is equivalent to 0.46 knots. Thus, it is virtually impossible for a target vessel to escape a doppler measurement by virtue of moving slowly through the water.

The subject system is virtually unlimited in resolution by virtue of performing the spectrum analysis with a number of short, albeit discontinuous, records of the sampled signal which can be built up to any desired length and which can be made to simulate continuous records. The ability to use discontinuous records permits batch processing such that while one short record is being correlated with a large number of reference signals each having a different frequency, a second record is being built up in the memory of the system to form another short record. With the subject invention it is possible to process data blocks separately and add them up so that the effective length of the record may be increased, for instance, by an order of magnitude without a corresponding increase either in the physical size of the memory or a corresponding increase in the amount of processing equipment.

Virtually unlimited resolution is accomplished since if T= record length, the resolution of the system is 1/T For example, if a record length at 100 Hz=2000 samples, then T=4 seconds and the resolution or bandwidth BW=¼ Hz. To increase the resolution, the record length is increased. For a resolution of ¹⁄₃₂ Hz the record length is multiplied by 8 so as to increase the number of samples from 2,000 samples to 16,000 samples. To accumulate 16,000 samples in one register and to process them would require a large amount of additional storage and processing.

In the subject invention, to solve the problem of the amount of storage and processing normally necessary, spectrum analysis is performed by breaking up the record into subrecords or segments, by processing the information in the subrecords or segments so as to eliminate the effects of the discontinuities and then by accumulating the results in accordance with the following equation for the above example:

$$E_o^i = \sum_{i=1}^{i=16,000} S_i R_i = \sum_{i=1}^{i=2000} S_i R_i + \sum_{i=2001}^{i=4000} S_i R_i + \ldots \sum_{i=14001}^{i=16,000} S_i R_i$$

Here $S_i$=input signal sample and $R_i$=reference signal sample.

The above block processing and accumulation can be accomplished if, and only if, the records which are initially discontinuous by virtue of being sectorized are effectively made continuous. This is to say that as a necessary condition there must be phase coherence between the reference signals utilized and those represented by the processed records. To establish phase coherency, the starting phase of the reference generator is adjusted for the length of the input signal which is lost due to the discontinuity between adjacent records and for the particular reference frequency employed.

Once the reference signal starting phase is adjusted to be that which is expected of a stable input signal which continues through the period of discontinuity, then phase coherency is effectively established and the batch processing may proceed. In the subject system, this is accomplished as follows:

A high resolution spectrum analyzer is provided which utilizes a frequency-stepped narrow band digital filter. To duplicate the long record, an incoming signal is divided up into short discontinuous records which represent discontinuous portions of the input signal. Each of these discontinous portions is correlated in a correlator which multiplies the incoming signal as represented by the discontinuous record with a large number of reference signals, each at a different frequency. In the correlation, this product is integrated to give the degree of correlation between the particular segment of the incoming signal and a particular reference signal. The results of the processing of each short signal record at a given frequency are accumulated and added together, one frequency and then another etc., with the results being the correlations of the input signal with the reference signals over a record having an effective length equal to the sum of the lengths of the short records. Any lack of phase coherency between the reference and input signals due to the discontinuity of the records is compensated for by measuring the length of input signal lost due to the discontinuity between adjacent input signal records and adjusting the starting phase of the reference signal at the start of the later record in accordance with the length of input signal lost and in accordance with the frequency of the reference signal so that the starting phase of the reference signal is equal to the phase of the input signal which would be expected to exist at the end of the discontinuity, were there no discontinuity.

Although batch processing necessitates splitting up of the record and processing different batches of data in a discontinuous manner, when high density rotating storage drums are used further problems are introduced. One of the problems is that data is typically written onto the drum in sectors or segments which are to carry a predetermined number of signal samples. However, due to variation or dither of the drum speed, and the asynchronous relationship between the drum and system clocks, gaps are created between successive signal records which gaps result in discontinuities in which varying numbers of data samples are unprocessed or dropped. Thus, with the variation in drum speed there are differing number of samples dropped and thus different lengths or discontinuities.

The solution to both batch processing discontinuities and the variable length discontinuities is to count the number of dropped samples and adjust the starting phase accordingly, since there is a fixed relationship between the change in the starting phase, $\phi$, missed sample count, h, sampling rate, $F_s$, and reference frequency, $f_i$.

Having determined the necessary phase adjustment for coherent spectrum analysis of the next record, the phase of the reference signal generator is adjusted via a phase selector and the output signal from the generator is coupled to the correlator. It will be appreciated that the referenced generator, phase selector, and correlator form a narrow band filter.

In one embodiment of the subject invention a so-called alpha ($\alpha$) generator is used to generate digital representations of the reference signals. The frequency, fr, of the $\alpha$ generator is determined by the $\alpha$, a binary code, which forms one of the inputs to the generator. In general, the output of the $\alpha$ generator is a series of binary coded signals, each of which represent a phase angle. These phase angles are then sequentially converted to amplitudes to form the reference signal.

Prior to the generation of the reference signal, the phase of the output of the $\alpha$ generator is set by making the generator's output code correspond to the desired starting phase, in this case, $\phi$. Thus, the number of missed samples is computed, and a binary phase angle input code, $\phi$, similar to $\alpha$ is generated which is dependent both on the missed sample count and the desired $\alpha$. This signal is applied to the $\alpha$ generator to initially set the phase of the signal to be generated. The $\phi$ signal is applied to the $\alpha$ generator one clock pulse prior to the application of the $\alpha$ signal corresponding to the particular frequency of interest. The setting of the starting phase is easily accomplished by passing the binary phase angle input code directly to the output terminals of the alpha generator, since the output from the alpha generator is normally a series of binary output codes each of which represents a phase angle. After setting the first output code, the next series of output codes are then sequentially converted to amplitudes to generate a reference signal having the required starting phase It is therefore an object of this invention to provide an improved spectrum analyzer capable of processing discontinuous records.

It is another object of this invention to provide an improved method and apparatus for detection of surface or subsurface vessels.

It is still a further object of this invention to improve the resolution of the spectral analysis in the acoustic frequency range by more than an order of magnitude through increasing of the length of record processed in a cross correlation type spectrum analyzer.

It is a still further object of this invention to provide coherency between discontinuous records in which the length of the discontinuity between adjacent records is measured and in which the starting phase of a reference signal is adjusted in accordance with the amount of signal lost over the discontinuity and in accordance with the particular reference frequency utilized.

It is a still further object of this invention to solve the problem of variable drum speed when rotating drum type memories are utilized to store incoming data, such that coherent cross correlation may be accomplished over what is effectively an extremely long record, or intergration time.

These and other objects of the subject invention will be better understood in connection with the following detailed description and the drawings in which:

BRIEF DESCRIPTION OF THE DRAWING

FIG. 5 is a block diagram of one type spectrum analyzer which utilizes a rotating drum storage and cross correlation for the spectral analysis;

FIG. 11 is a diagramatic representation of process flow for spectrum analysis over a number of different reference frequencies;

DETAILED DESCRIPTION

Figure 1:
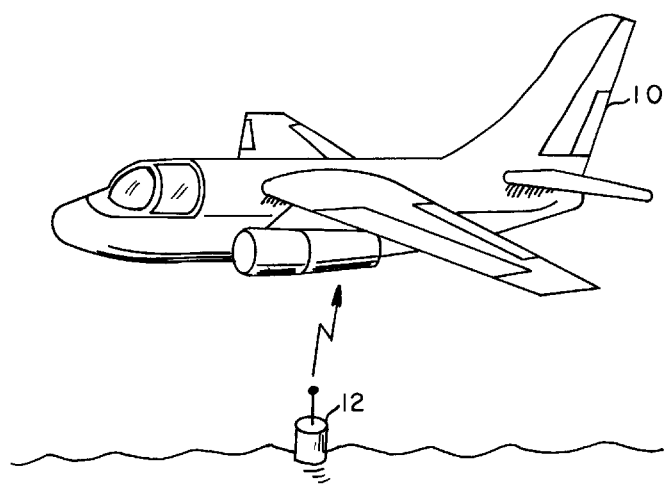
FIG. 1 is a diagramatic representation of a sonobuoy transmitting subsurface signals to an overflying aircraft.

Referring now to FIG. 1, a typical long range patrol aircraft 10 is illustrated as overflying a sonobuoy generally indicated by reference character 12 which, in this case, is a passive sonobuoy which detects subsurface acoustic signals, and which transmits these signals via a radio link to the overflying aircraft. In a typical situation, a number of sonobuoys are deployed over a given area and are addressable via the overflying aircraft. The individual sonobuoys respond with a unique address code that identifies the addressed sonobuoys to the overflying aircraft. While the subject system will be described in terms of passive sonobuoys, it will be appreciated that any type periodic signals may be analyzed via the subject spectrum analyzer. Thus, the subject system has application in the analysis of the spectral components of any signal, be it derived from sonobuoys or otherwise. It will be further appreciated that while the subject invention is described in connection with ASW operations, the subject spectrum analyzer may be utilized as a laboratory instrument of exceedingly high resolution, especially at the low frequency end of the spectrum.

Figure 2:
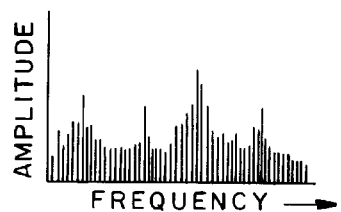
FIG. 2 is a amplitude versus frequency graph of a typical spectrum produced by a submarine or other type vessel.

In the aforementioned ASW application of the subject apparatus, passive listening sonobuoys sense and relay subsurface acoustic signals which are the input signals analyzed by the subject spectrum analyzer. Referring to FIG. 2, a typical spectrum generated by a subsurface vessel is illustrated. It will be appreciated that vessels such as submarines produce acoustic signals by virtue of the rotating machinery running within the submarine as well as the passage of the submarine through the water. Such signals may, for instance, be due to the operation of internal combustion engines such as diesel engines which, in general, because they do not run at a constant rate throughout their cycle produce broadened spectral lines. On the other hand, turbine-driven craft exhibit narrow spectral lines. Likewise, pumps and other rotating shaft equipment produce unique periodic acoustic signals which can be detected at, some distance from the vessel. In addition, there are acoustic signatures associated with the movement of the vessel itself through the water. All of these signals contribute to make up the spectral signature of the vessel. In addition to the frequency and amplitude of signals from the vessel, the aspect or orientation of the vessel with respect to the detection system can be determined both by doppler shift and by its signature so that the direction and speed of the vessel with respect to the detecting device can be ascertained.

Figure 3:
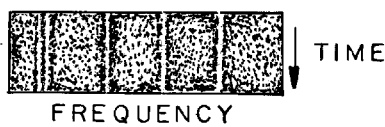
FIG. 3 is a "gram" display of the spectral signature illustrated in FIG. 2 in which the density of the gram is proportional to the amplitude of the signal, in which frequency is measured on the horizontal axis and in which the passage of time is measured along the vertical axis.

One display, illustrated in FIG. 3, which is extremely effective in presenting spectral signature information is called a "gram" display. As can be seen, the amplitude of a signal is represented by the intensity of the white dots in the gram, whereas the placement of the white dots along the horizontal axis indicates the frequency of the signal. The time history of the signal is provided on the vertical axis.

Figure 4:
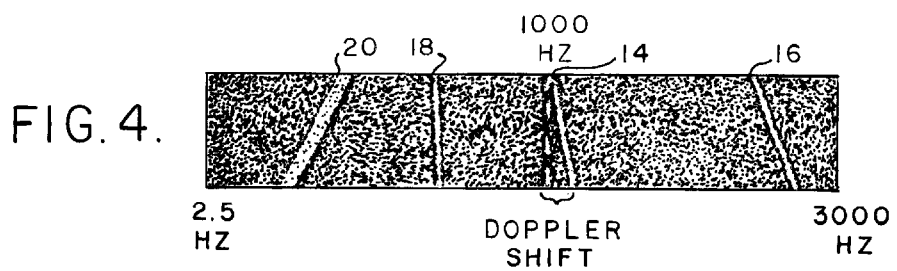
FIG. 4 is an expanded view of a gram type display illustrating the resolution of doppler shifts on the order to ±1/64% of the frequency of the received signal.

Referring to FIG. 4, assuming that the spectrum analyzer has the requisite resolution, then the slope of the gram line indicates the rate of doppler shift of the signals as the vessel moves by the detector. As mentioned hereinbefore, while prior art spectrum analyzers in the acoustic range were able to resolve ±¼% of the frequency of interest, the subject system is able to resolve ±1/64% of the frequency of interest. This permits the resolution of movement either to or from the sensing device of 0.46 knots.

As can be seen from FIG. 4, such a shift is illustrated by a line 14 and a like shift is also illustrated by line 16; which line is presumably from the same vessel. A stationary source is illustrated at line 18 and a moving source having a fairly broad spectral line is illustrated by reference character 20. Typical apparatus for generating these gram displays is now discussed.

Referring to FIG. 5, a typical cross correlation type spectrum analyzer includes apparatus 22 for quantizing signal samples, in which the quantized signal samples are designated by $S_i$. These are applied to a correlator 24 which correaltes the quantized signal samples with a quantized reference signal $R_i$ from a reference signal generator 26, the frequency of which, $f_i$, is stepped from $f_1$, to $f_n$ by a frequency control or stepping unit 28.

In general, unit 22 is provided with a input signal via line 30 in which the signal is generally represented by S=x(t). This signal is typically a periodic signal which is coupled to a low pass filtering and automatic gain control circuit 32 of conventional design. The filtered analog signal from circuit 32 is converted by a conventional analog-to-digital converter 34 at a sampling rate $F_3$ to a digital representation of the input signal. The output of the analog to digital converter is applied to a storage and control unit 36, the function of which is to segment the data from the analog-to-digital converter, store it, and write it onto a rotating drum 38 which, in this embodiment, functions as a high density storage medium. Thereafter, the data is read off the drum through unit 36 to a buffer 40 which stores the records prior to processing.

As drum 38 rotates, the digital data from the storage and control unit 36 is written on the drum in sectors, each ideally having a uniform length and therefore a uniform number of samples recorded in the sector. However, due to the variation in the velocity of rotation of the drum, $\Delta v$, different numbers of samples are written into each of the sectors on the drum. The amount or number of samples written into a sector is dependent upon the length of signal which is to be correlated during any one batch process. As can be seen, due to the variation in drum speed, it is impossible to write in exactly the same number of samples into each sector on the drum. This results in some sectors having for instance, 2,150 samples while other sectors may have as few as 2,050.

Arbitrarily choosing 2048 samples as the desired number of samples for processing it will be appreciated that some samples must be dropped out of each sector in order to reach this number. The number is, in fact, chosen so that it will always be less than the number of samples which are to be processed at any one given time. This, of course, accounts for the discontinuous records.

Figure 6:
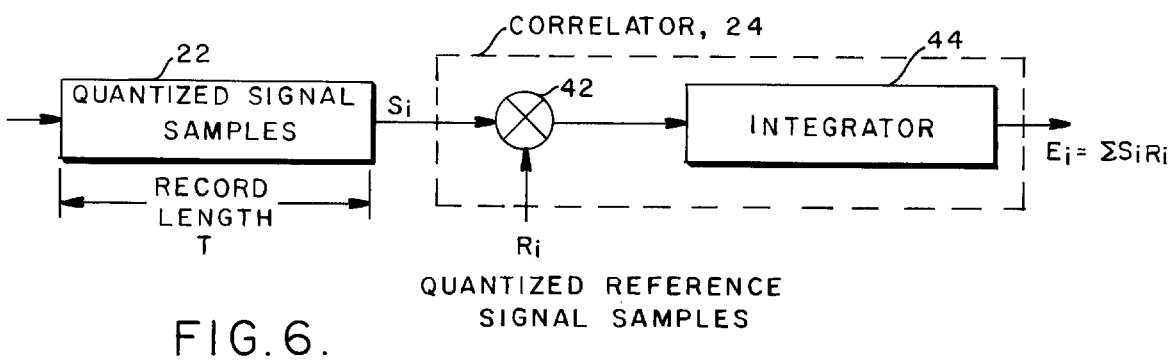
FIG. 6 is a block diagram illustrating a correlator in which a sample signal is multiplied by a reference signal and either accumulated or integrated.

Referring to FIG. 6, the length of the record to be utilized is illustrated by reference character T. As mentioned hereinbefore, it is the length of this record which determines the resolution of the spectrum analyzer. In general, the spectrum analyzer involves a correlator, which may be viewed as a narrow band digital filter employing a multiplier 42 which multiplies the quantized digital signals and applies the product to an integrator 44 which may be in the form of a simple accumulator. The output, $E_o$, is therefore equal to $$\sum_i S_i R_i.$$

The filter response has a $$\frac{\sin x}{x}$$

response in the frequency domain. It will be appreciated that the well known technique of weighting the output of the correlator for respective blocks of data may be applied to achieve lower side lobes than the $$\frac{\sin x}{x}.$$

The well known Hanning weighting is an example. The weighting would be performed in the postprocessing operation and in no way militates against the effectiveness of the system.

The significance of this is that $E_o$ will be at a maximum when there is both frequency correlation and phase correlation between the quantized input signal $S_i$ and the quantized reference signal $R_i$. By stepping the frequency of the reference signal $R_i$ until there is a correlation, the frequency and amplitude of an unknown input signal can be ascertained.

However, the resolution by which such a narrow band digital filter can operate is proportional to the length of record processed. As noted in connection with FIG. 5, since it is desirable to process discontinuous samples, such a correlator could not correlate a number of sectors of recorded information because any incoherency or phase difference between the signal at the beginning of the discontinuity and at the end of the discontinuity would produce cancellation in this type of correlator.

Figure 7:
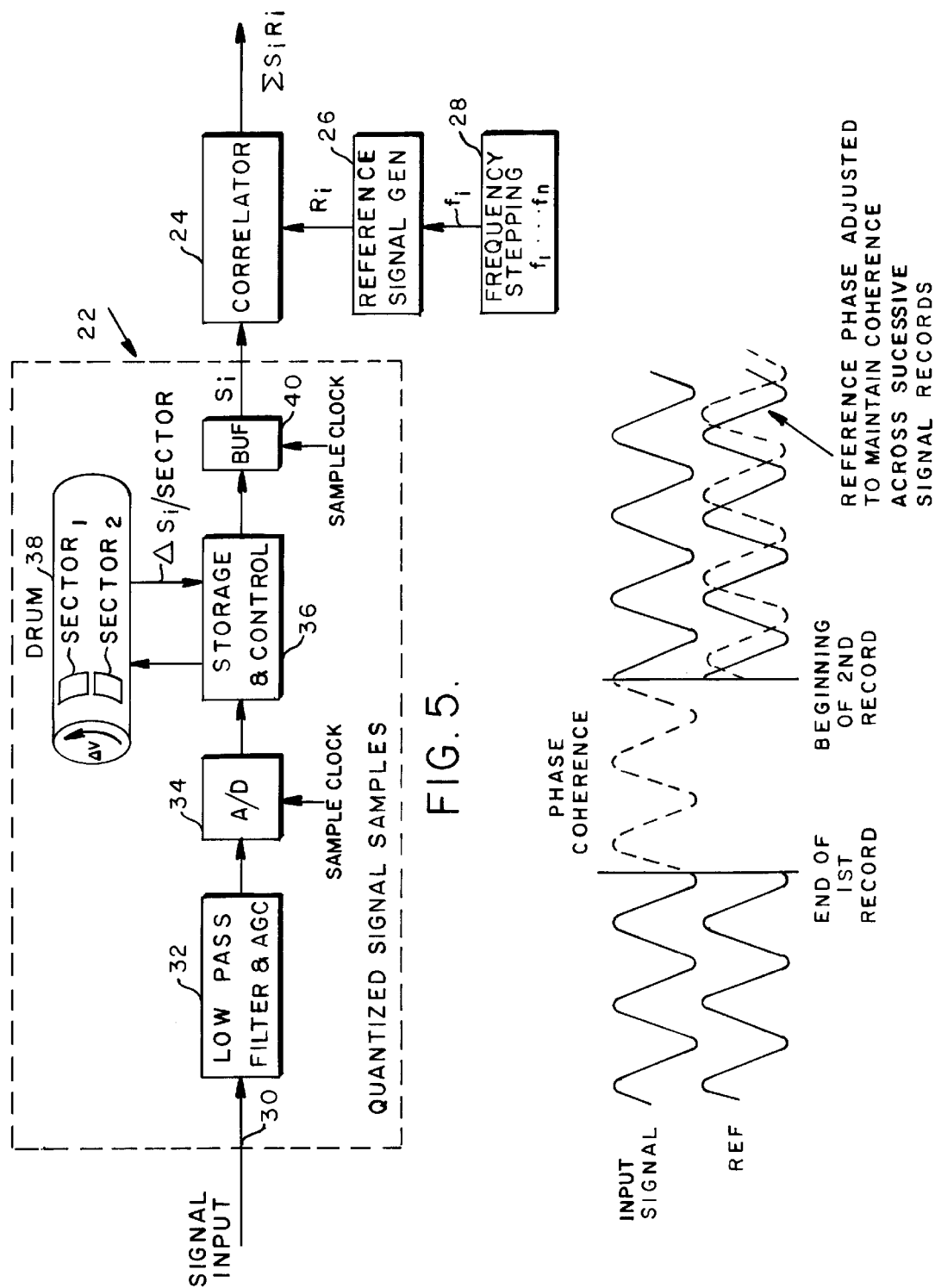
FIG. 7 is a waveform diagram illustrating the principle of phase coherence between an input signal and a reference signal over a discontinuity.

This situation can be seen by referring to FIG. 7. In this figure, the input signal is at the top of the waveform diagram, whereas a reference signal of the same frequency and phase is at the bottom of the waveform diagram. At the end of the first record both the input signal and the reference signal are in phase. At the end of the first record the reference signal is interrupted, changed in frequency and restarted to correlate the first record with a different reference frequency. This change of frequency continues until all frequencies of interest are correlated with the first record. The reason for this type system is to save processing time. It will be appreciated that normally it would be necessary to wait for a complete record to be compiled prior to doing the correlations with the reference frequency signal. With the subject system correlations are done on one record while the next record is being compiled. Thus, the present system provides overlapping on concurrent processing with an increased length record.

It can be seen that, in the subject system, the reference frequency generator is not run continuously at one frequency. If it were, the reference and input signals would be phase coherent regardless of the length of the discontinuity between the records. Since the reference frequency generator is stepping through its entire range of frequencies for each record, at the beginning of the second record the reference signal may start at a different phase relative to the phase of the input signal. A further phase difference is due to the asynchronous relationship between the drum speed and the system clocks. As can be seen by the dotted waveform in the lower righthand portion of the waveform diagram, the reference signal (if not allowed to run) is out of phase with the input signal at the start of the second record.

Figure 8:
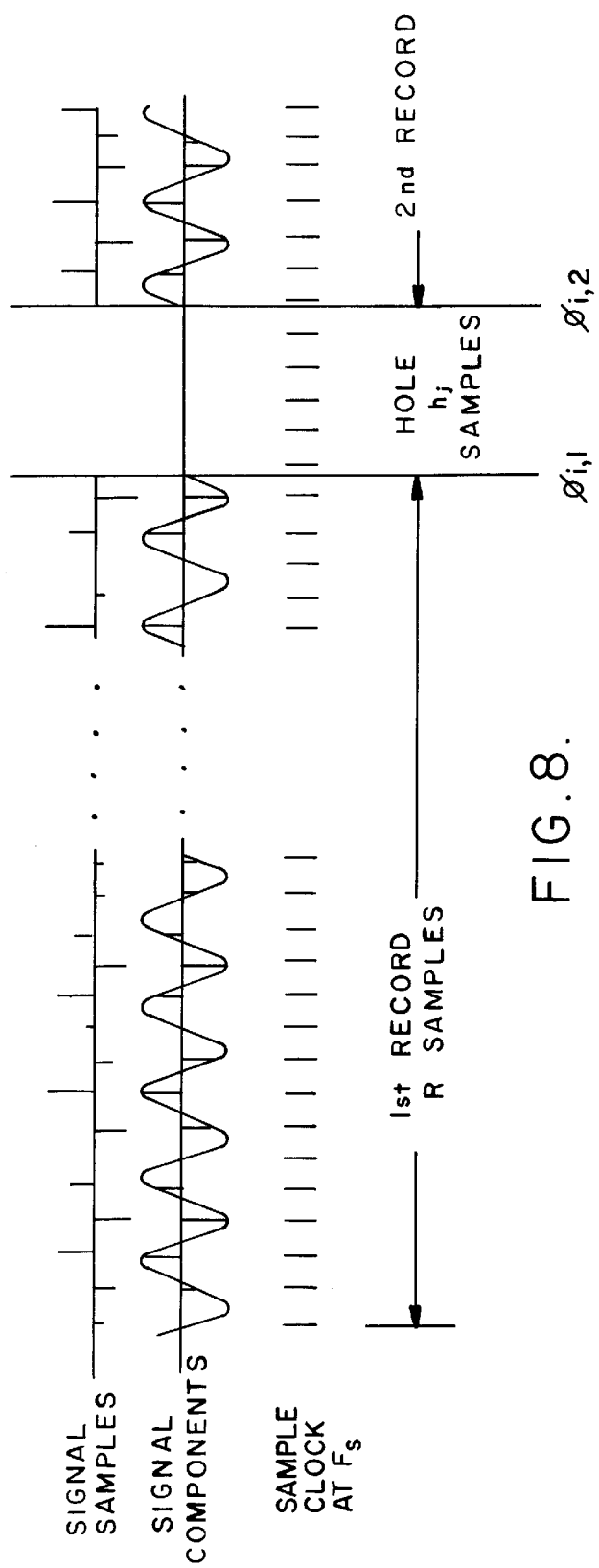
FIG. 8 is a waveform diagram illustrating the sampling of a signal at somewhat faster than the Nyquist rate and illustrating measurement of the amount of signal lost over a given discontinuity in terms of the number of samples lost.

It is an important aspect of the subject invention that the starting phase of the reference signal is adjusted at the beginning of the second and subsequent records, and this is done in accordance with the amount of input signal lost over the discontinuity. In one embodiment, as shown in the waveform diagram of FIG. 8, the number of samples lost over the discontinuity between the first record and the second record is counted and the starting phase of the reference signal at the beginning of the second record is adjusted as illustrated in FIG. 7 so that there is phase coherence between the reference signal and the input signal. As can be seen in FIG. 8, the input signal is sampled at a rate $F_s$ which, as shown, is generally about 25% greater than the Nyquist frequency. The resulting signal samples are shown on the top line of the waveform diagram. As can be seen, the amount of signal lost over the discontinuity is reflected in the number of lost samples, h. By knowing the reference frequency and the number of lost samples, the phase at $\phi_{i,2}$ can be calculated, where "i" is the reference frequency and "2" denotes the second record.

Figure 9:
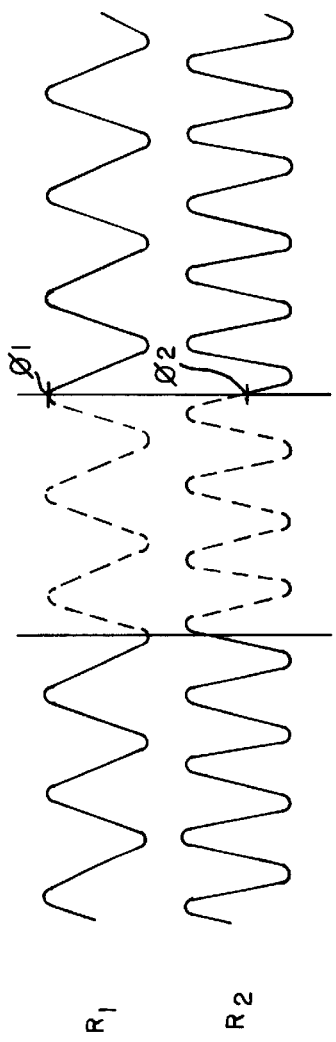
FIG. 9 is a waveform diagram illustrating the phase difference between two different reference signals at the end of the same discontinuity.

Referring now to FIG. 9, obviously, the phase to which the reference generator must be set is also dependent on the frequency of the reference generator. As can be seen in FIG. 9 where two signals of different frequencies are shown, at the end of the same discontinuity the signals will exhibit different phases $\phi_1$ and $\phi_2$ respectively. This waveform diagram is presented merely to show the dependence of the starting phase not only on the lost sample count, but also on the reference frequency.

Figure 10:
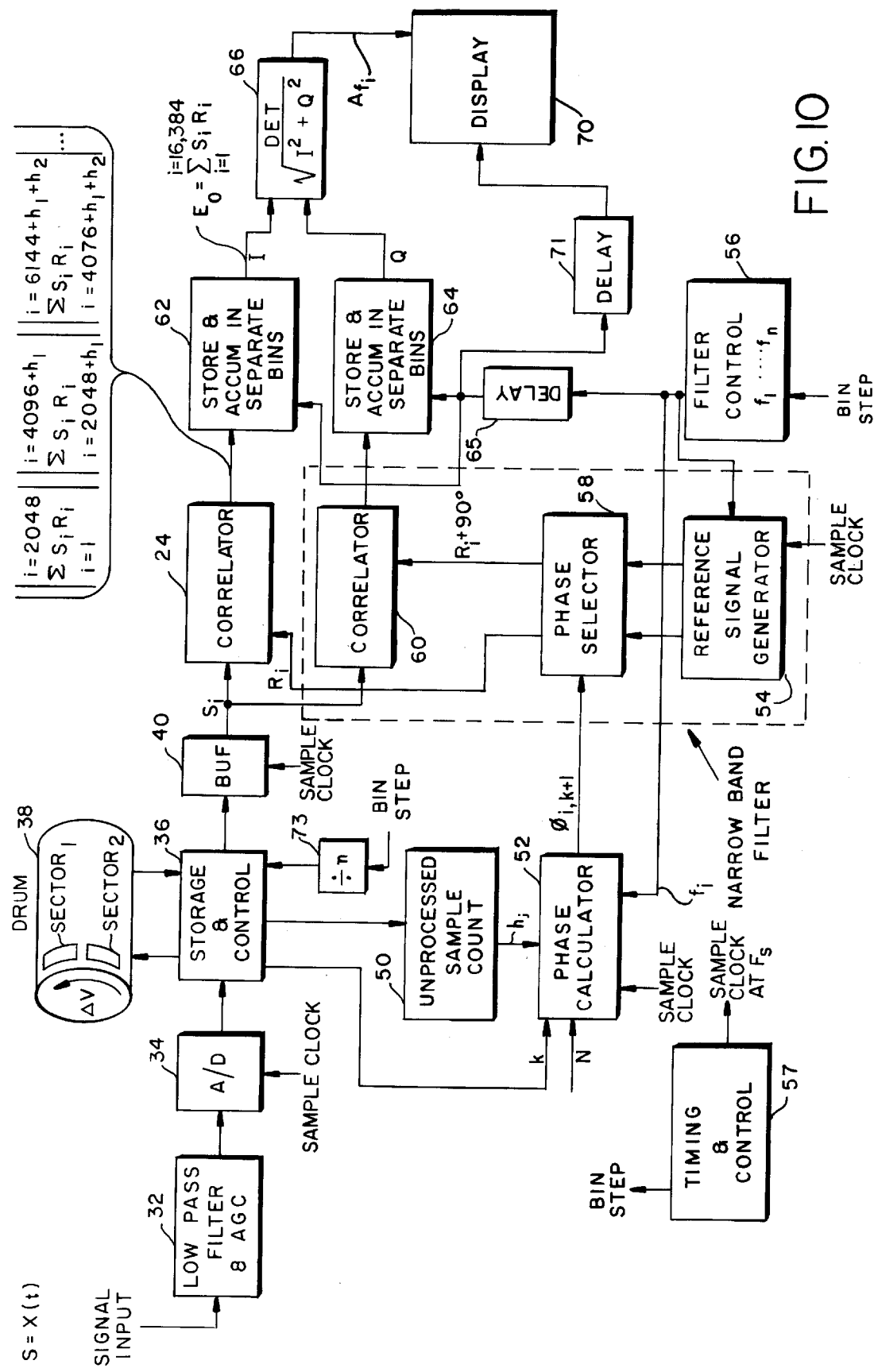
FIG. 10 is a detailed block diagram illustrating a spectrum analyzer in which the unprocessed samples are counted and the starting phase of a reference generator is adjusted in accordance with the unprocessed sample count and the particular reference frequency utilized.

Referring now to FIG. 10, a high resolution spectrum analyzer is illustrated, in which like elements in FIGS. 10 and 5 carry like reference characters. In order to measure or ascertain the length of unprocessed signal, an unprocessed sample counting unit 50 is coupled to storage and control unit 36. The purpose of this unit is to count the number of samples read out of a sector of drum 38 and to subtract from this number a fixed number such as 2048, thereby obtaining a missed or unprocessed sample count, $h_j$. The output of the unprocessed sample counting unit is applied to a phase caluclator 52 which also has as an input a signal representing the reference frequency, $f_i$ which is generated by a reference signal generator 54 controlled by a filter control unit 56. Filter control unit 56 supplies a signal to the reference signal generator which, in effect, steps the reference signal generator through a series of frequencies called frequency "bins". The starting and stopping of the bin processing is controlled by a unit 57 which generates bin stepping commands and the sample clock. In one operative embodiment, for each octave (frequency doubled band) of the spectrum analyzer, the reference signal generator is stepped 256 times such that it generates 256 different reference signals at its output. Reference signal generator 54 may be one of any number of digital frequency synthesizers, the output of which is controlled by a binary number from the filter control unit. Alternatively, the reference signal generator may be any one of a number of voltage controlled oscillators, the output of which is converted to a digital signal. Filter control unit 56 in this latter case is merely a source of different control voltages.

Phase calculator 52 calculates the phase angle, $\phi$, by which the signal from the reference generator must be shifted in order that the initial starting phase of the signal from the reference signal generator be at the correct value with respect to the starting phase of the signal of the next record.

In order to do this, the ending phase at the end of each record must be stored and, at the beginning of the next record, a phase, $\phi$, must be added to the stored phase. $\phi$ must have a value which exactly accounts for the unprocessed signal samples between the two records so as to maintain phase coherence. The phase at the end of any record is established by keeping track of the number of records previously processed, e.g. the record number, k, of the last record processed, the total number of signal samples actually processed, kN (where N=2048 in one example), and the total number of unprocessed signal samples, $$H_k = \sum_{j=1}^{j=k} h_j.$$

Here $h_j$ refers to the number of unprocessed samples between the $j^{th}$ record and the the j+1 record. The starting phase for any record, and frequency, is $\phi_{i, k+1} = 2\pi(kN+H_k)\alpha_i$, where $$\alpha_i = \frac{f_i}{F_s}.$$

This relationship is derived hereinafter and is calculated for each k+1 record for each reference frequency "i" by phase calculator 52 in a conventional manner.

The output of the phase calculator, $\phi_{i, k+1}$, is applied to a phase selection circuit 58 at the appropriate time just prior to the start of the processing of the k+1 record for each frequency bin "i". As illustrated, the output signal from the reference generator is applied to phase selection circuit 58. When each record is correlated with reference signals having frequencies $f_1 \ldots f_n$, then the output of the phase calculator is $\phi_{i, k+1}$; $\phi_{2, k+1}$; $\phi_{3, k+1} \cdots \phi_{n, k+1}$. These values may be stored at the phase calculator and sequentially applied to the phase selector just prior to the processing of the k+1 record with the corresponding reference frequency signals. The output of the phase selection circuit is in the form of two signals, $f_i+\phi_{i, k+1}$ and $f_i+90°+\phi_{i, k+1}$, each with the appropriate starting phase, $\phi_{i, k+1}$. The 90° phase shift between the two signals provides in-phase and quadrature reference signals with the appropriate starting phase to permit conventional in-phase and quadrature processing. In-phase and quadrature processing is conventional and is utilized in order to accommodate an unknown phase relationship between the incoming signal and the signals generated by the reference signal generator. The outputs of phase selection circuit 58 are coupled to correlator 24 which is in the I channel, and to a correlator 60 which is in the Q channel. The output of buffer 40 is coupled to the inputs of both of these correlators, and the outputs of these correlators are coupled respectively to accumulator 62 and accumulator 64. The accumulators store the outputs of their respective correlators in separate frequency bins and accumulate or add together the correlation values for each frequency bin as they come in. The output from correlator 24 is illustrated immediately thereabove and constitutes the correlation of the input and reference signals over the individual discontinuous records at a given reference frequency.

Because of the coherence between the records which is established by virtue of the phase calculation and phase selection, the output from the accumulators is that shown upwards and to the right of accumulator 62. The stored accumulated correlated values from accumulators 62 and 64 for each frequency bin are read out of storage in accordance with the frequency sequence determined by control 56. The signal from control 56 is delayed by delay 65 for a time equal to the processing time for the correlation and then for any other length of time that is convenient. The accumulated values for each frequency bin are sequentially read out to a detector 66 which detects $\sqrt{I^2+Q^2}$ and the output of the detector is applied to a display 70. For each frequency bin, the output of detector 66 is a signal whose amplitude corresponds to the degree of correlation between the unknown signal and the corresponding reference signal. As will be appreciated, the output of delay 65 is delayed at unit 71 and is applied to the display such that the output from detector 66 can be correlated with the frequency bin read out from the accumulators. The delay of unit 71 corresponds to the processing time for the accumulators and detector 66.

One way of performing this spectrum analysis is to read out all the sectors of the drum consecutively and correlate this record with a given reference signal at, for instance, the lowest frequency of interest. Thereafter, the sectors may again be read out with the reference signal next higher frequency. However, processing time is lost since correlation at each frequency must wait until the total record is built up.

To alleviate this problem, the data record from the drum is read out of the drum, a sector at a time, to buffer 40 where it is stored. This is accomplished by unit 36 which is clocked to read out another sector after correlation with one sector has been accomplished for n different frequencies via a divide-by-n circuit 74 coupled to the bin stepping output of unit 57.

As illustrated in FIG. 11, assuming a first sector or record $k_1$, a second sector or record $k_2$, etc., and assuming reference signals $f_1$, $f_2$, etc., the processing may be performed as follows:

For n=256, the data in the first record, $k_1$ is read out 256 times from buffer 40 to the I and Q channel correlators. Each time the buffer is read out, the $k_1$ record is correlated with a reference signal of a different frequency.

The results of the 256 correlations are stored at the appropriate bin of the associated accumulator and buffer 40 then presents the data in the second record, $k_2$, for correlation. It will be appreciated that between the first and second records there is a discontinuity and this discontinuity depend on not only the number of unprocessed samples, but also upon the particular reference frequency to which the input data is correlated. Thus, there are 256 phase calculations which must be made prior to the next 256 correlations of the $k_2$ record with the $f_1 \ldots f_n$ reference signals, in which the starting phase must be achieved just prior to the generation of each reference frequency signal. This is true even though the hole count for each reference signal will be the same between adjacent records. This is an iterative process which continues until the last of the records, $k_m$ is processed and the results stored and accumulated or added in the corresponding frequency bins. The stored and accumulated or added outputs of the I and Q accumulators are then read out by frequency to the detector. The output of the detector is, of course, one-to-one correlatable with frequency, and the amplitudes and positions of the lines displayed represent the spectra of the incoming signal.

With respect to the operation of the phase calculator, in order to accomplish coherent integration with discontinuous records of the signal, two things are required: first, the phase of the reference frequency at the start of the k+1 record must be the same as that at the end of the $k^{th}$ record and, if there are any gaps between the two records, the phase must be advanced such that it is the same as if the missing samples has been processed. The derivation of the required relationships is presented below. The terms used in this derivation are defined as follows:

N=number of samples in each record processed $F_s$=sampling frequency $f_i$=center frequency of the $i_{th}$ frequency bin $$\alpha_i = \frac{f_i}{F_s}$$

$h_j$=number of holes (unprocessed samples) between the $j^{th}$ and j+1 records $h_k$=number of holes, $h_j$, (unprocessed samples) between the $k^{th}$ and k+1 records $$H_k = \sum_{j=1}^{j=k}$$

i.e. $H_k$ is the cumulative hole count up to the beginning of the k+1 record $\phi_{i,\,k}$=phase of the reference signal $f_i$ after k records (not including the holes) after the $k^{th}$ record $\phi_{i,\,k+1}$=phase of reference signal $f_i$ at the start of the k+1 record Considering $f_1$, the lowest frequency bin of the spectrum analyzer, the phase calculator will determine the phase at the end of the first record, the additional phase change for the holes between the first and second records and, thus, the required phase of the reference oscillator at the beginning of the second record. This result is extended simply for any arbitrary number of records and finally will be modified to apply to any other frequency.

Referring back to FIG. 8, the waveform on the first line represents a frequency component, $f_1$, of the signal which is sampled at the rate $F_s$ for a total of N samples comprising one record. The record spans a period of time, $T_N=N/F_s$. Dividing this time by the period of $f_1$, (i.e. multiply by $f_1$) gives $T_N f_1=Nf_1/F_s$ which, multiplied by $2\pi$, is the phase of $f_1$, in radians, at the end of the first record, viz:

$$\phi_{1,1}=2\,\pi Nf_1/F_s \quad (1)$$

By substitution, this becomes:

$$\phi_{1,1}=2\,\pi N\alpha_1 \text{ radians} \quad (2)$$

The phase change corresponding to the holes (unprocessed samples) between the first and second records is calculated similarly, yielding:

$$\phi_{1,2}-\phi_{1,1}=2\,\pi h_1\alpha_1 \text{ radians} \quad (3)$$

where $h_1$ is the number of unprocessed samples between the first and second records. The required phase of the reference oscillator at the beginning of the second record is therefore:

$$\phi_{1,2}=2\,\pi\alpha_1(N+h_1) \text{ radians} \quad (4)$$

where $\phi_{1,2}$ is the phase adjustment for reference frequency 1 of the second record.

At the beginning of the k+1 record, the required starting phase for reference frequency, $f_i$ is:

$$\phi_{1,\,k+1}=2\,\pi\alpha_1(kN+H_k) \text{ radians} \quad (5)$$

where $H_k$ is the cumulative hole count defined above. For reference frequency $f_2$, $$\phi_{2,\,k+1}=2\,\pi\alpha_2(kN+H_k) \text{ radians} \quad (6)$$

For any arbitrary reference frequency $f_i$, $$\phi_{1,k+1}=2\,\pi\alpha_1(kN+H_k) \text{ radians} \quad (7)$$

$\phi_{i,k+1}$ can be expressed as an iterative relationship which leads to a simpler implementation. Most spectrum analyzers operate as constant resolution devices in the high resolution mode and this condition will be assumed. Then, $$f_{i+1} - f_i = \Delta f \quad (8)$$

and $$\alpha_{i+1} - \alpha_i = \frac{\Delta f}{F_s} \quad (9)$$

$F_s$ is constant for any given reference frequency range so that $$\frac{\Delta f}{F_s}$$

is also constant within the reference frequency range; call this $\Delta\alpha$ so that, $$\alpha_{i+1} = \alpha_i + \Delta\alpha \quad (10)$$

$$\phi_{i+1, k+1} = 2\pi\alpha_{i+1}(kN + H_k) \quad (11)$$

Substituting $\alpha_{i+1}$ from (10) into the above equation:

$$\phi_{i+1, k+1} = 2\pi(\alpha_i + \Delta\alpha)(kN + H_k) \quad (12)$$

$$\phi_{i+1, k+1} = 2\pi(kN + H_k)\alpha_i + 2\pi(kN + H_k)\Delta\alpha \text{ radians} \quad (13)$$

hence $$\phi_{i+1, k+1} = \phi_{i, k+1} + \Delta\phi_{k+1} \quad (14)$$

where $$\Delta\phi_{k+1} = 2\pi(kN + H_k)\Delta\alpha \quad (15)$$

The iterative procedure starts with the calculation of $\phi_{1, k}$, the starting phase for frequency bin #1 at the beginning of the k record. This value is stored for use in processing subsequent bins. $\Delta\phi_k$ is calculated prior to processing frequency bin #2 and is added to the stored value of $\phi_{1, k}$ to yield $\phi_{2, k}$, the starting phase for bin #2. This value is stored in lieu of $\phi_{1, k}$ and in turn is incremented by $\Delta\phi$ for $\phi_{3, k}$, etc., until the last bin has been processed for that record.

Following the processing of all bins for the $k^{th}$ record, the hole count between the $k^{th}$ and k+1st record is obtained and the phase adjustment for the k+1 processing cycle is calculated as follows:

$$\phi_{1, k+1} = 2\pi\alpha_1(kN + H_k) \quad (16)$$

$$\phi_{1, k+1} = 2\pi\alpha_1(kN + H_k + h_k) \quad (17)$$

where $H_k$ is the cumulative hole count up to the $k^{th}$ record. And $h_k$ is the hole count between the k and k+1, record. Thus, $$\phi_{1, k+1} = \phi_{1, k} + 2\pi\alpha_1 h_k \quad (18)$$

The process is one of saving (storing) the value of $\phi_{1, k}$ calculated for the preceeding record and adding to it the hole count for the current record times $2\pi\alpha_1$. i.e. $2\pi\alpha_1 h_{k+1}$. This value of $\phi_{1, k+1}$ is the starting point for processing all the bins, (as described above) for the k+1 record and, also is stored for calculation of $\phi_{1, k+2}$ for the next record.

In equation 1 the factor $2\pi$ was introduced to convert frequency cycles to radians. This was done to use a familiar measure of phase. In actual practice it has been easier to implement the phase adjustment by expressing phase as a fractional part of a cycle. This simply means dropping the $2\pi$ and the word radians from equation 1 and all subsequent equations herein pertaining to phase. Also, it should be noted that the integer parts of these equations are redundant (representing complete periods of the phase function) and only the fractional part is normally used.

Referring back to FIG. 10, by virtue of the phase calculation described, assuming that the desired number of samples per sector is 2048, and assuming an actual count of samples of 2056 then, it will be appreciated that the unprocessed sample count, $h_j$, is equal to 8, which, in turn, is equal to a phase advance of 240° with $F_s = 3f_i$. This is the phase advance which is calculated by phase calculator 52 and supplied to phase selector 58.

Figure 12:
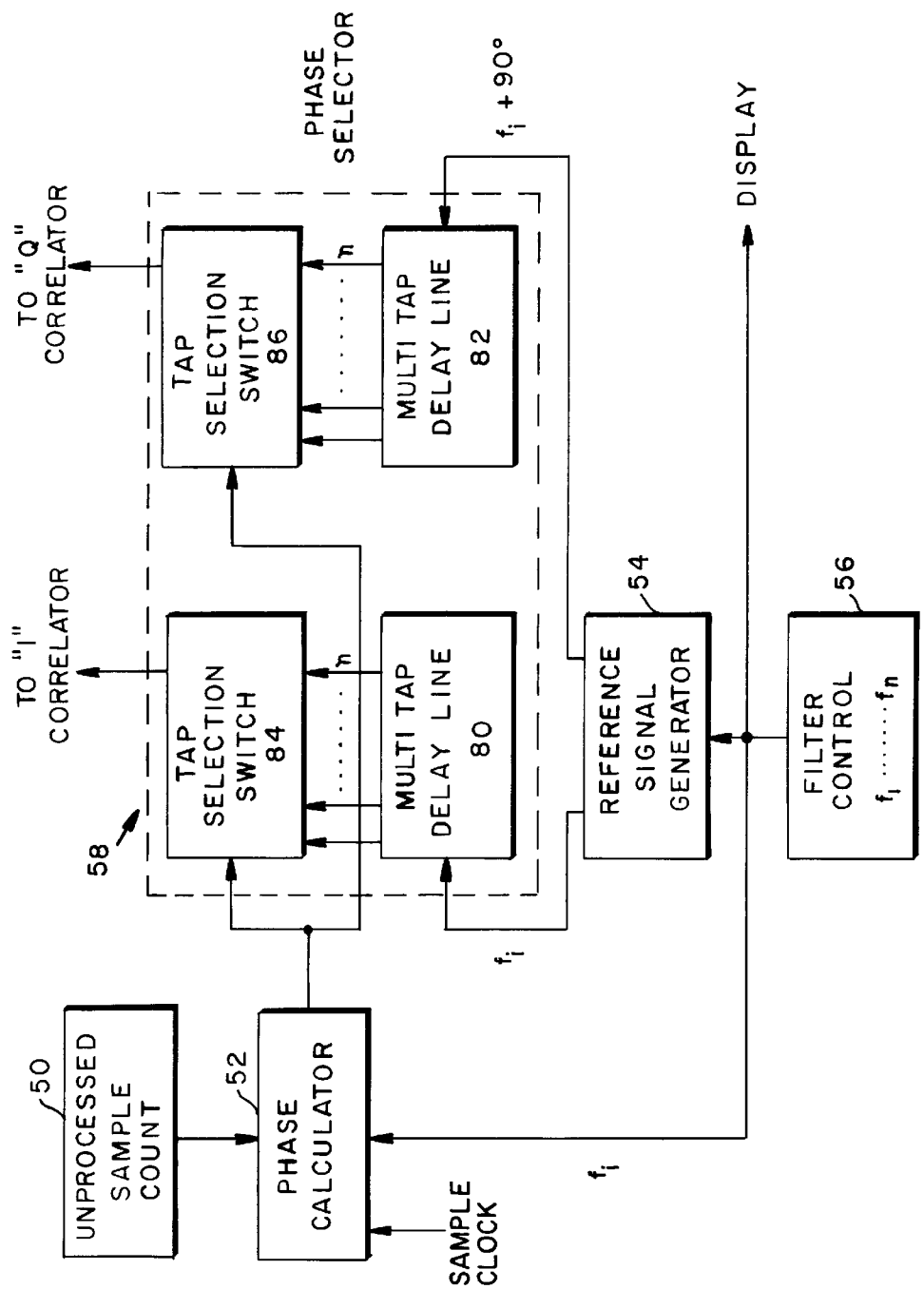
FIG. 12 illustrates one type of phase selector which may be utilized or driven by the phase calculator of FIG. 10.

Referring now to FIG. 12 in one embodiment, phase selector 58 may take on the configuration of a tapped delay line and tap selection switch configuration. In this embodiment, the signals from reference generator 54, 15 $f_i$, $f_i + 90°$ are applied respectively to multi-tap delay lines 80 and 82. These delay lines are of a conventional design and the taps thereof are coupled to tap selection switches 84 and 86, respectively. Tap selection switches are conventional active analog switches which are positioned in accordance with the phase advance from phase calculator 52. In this way, the starting phase of the signals from reference generator 54 may be controlled by virtue of particular delay line tap selected. Upon the calculation of the appropriate phase, the signal from the phase calculator both positions the switch and thereby affects the appropriate connection of the delay line to the correlator in timed relationship to the $F_s$ signal.

In general, for phase selection:

$$T_N = \frac{N}{F_s} \quad (19)$$

$$\phi_i = T_N f_i \quad (20)$$

where $\phi_i$ is in units of cycles and fractional cycles of $f_i$ and N, and where N=no. of processed samples, $F_s$=is the sampling frequency, and $f_i$=the center frequency of the $i^{th}$ frequency bin.

In the most general case $\phi_i$ will be an improper number. For instance, let:

$A_i$=integral part of $\phi_i$
$B_i$=fractional part of $\phi_i$

Since $f_i$ is periodic, $A_i$ denotes the number of full periods of $f_i$ which always return to the same starting phase and require no consideration. $B_i$ then is the necessary phase correction required. Since the phase selection is shown implemented with a tapped delay line, it should be converted to time by multiplying the fraction of a cycle, $B_i$, by the period of one cycle, $$\frac{1}{f_i},$$

giving $$T_i = \frac{B_i}{f_i}.$$

The propagation delay and number of taps on the delay line must be chosen such that selection of the delay time by the phase calculator can be made to within 1/32 of the period of the highest $f_i$. This will guarantee less than 0.08 db loss compared to ideal coherent integration.

Figure 13:
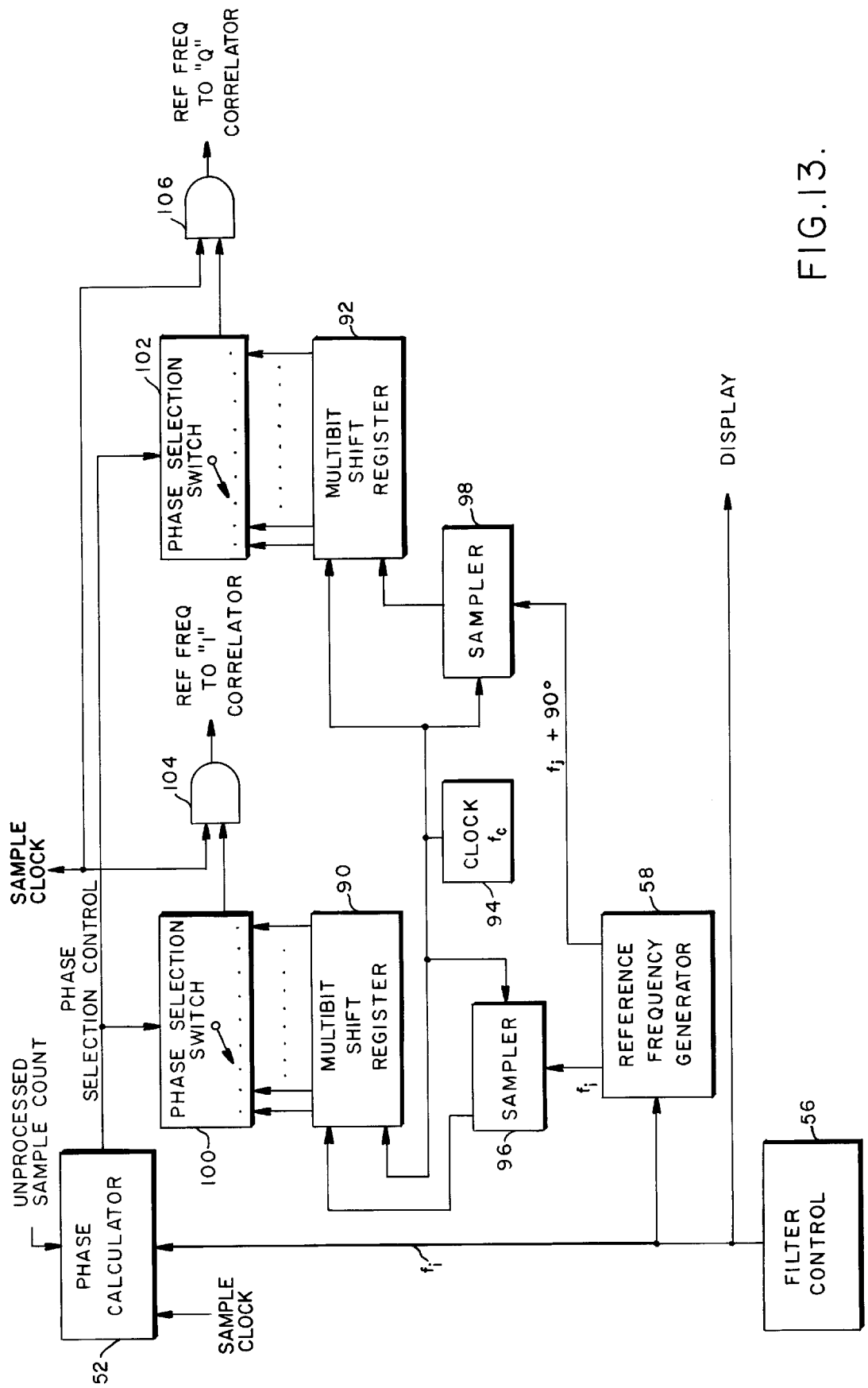
FIG. 13 is a block diagram of another type of phase selector which may be utilized with the reference frequency generator of FIG. 10.

The phase selection may also be accomplished by a multibit shift register as illustrated in FIG. 13, with the shift registers being denoted by reference characters 90 and 92, respectively. In this embodiment, the output of the reference frequency generator is sampled at a clock rate $f_c$ via clock 94 which is applied to sampling devices 96 and 98, respectively, which may be AND gates. The output of clock 94 is also coupled as an input to multibit shift registers 90 and 92. The sampled output of the reference frequency generator is applied to the input terminals of the multibit shift registers as the digital equivalent of the sampled reference frequency $f_c$. Successive samples of the reference frequency are shifted down the shift register at the clock rate $f_c$, which is much greater than $f_i$. In a typical case $f_c$ may be 32 times $f_i$.

As in the FIG. 12 embodiment, the multibit shift registers are in effect tapped delay lines and the taps are coupled to phase selection switches 100 and 102, respectively, with phase calculator 52 responsible for the positioning of the phase selection switches. The outputs of the phase selection switches are coupled to one terminal of two input terminal AND gates 104 and 106, respectively, with the other input to these AND gates being the sampling signal $F_s$.

In this embodiment, it will be appreciated that the multibit shift register is, in fact, a digital delay line for the sampled reference frequency signal. The phase selector switch, by selecting taps of the multibit shift register, determines the starting phase of the signal from the reference frequency generator.

Although preferred embodiments of the invention have been described in considerable detail for illustrative purposes, many modifications will occur to those skilled in the art. It is therefore desired that the protection afforded by Letters Patent be limited only by the true scope of the appended claims.

What is claimed is:

1. Apparatus for generating the spectra of an incoming signal comprising:
   means for digitally sampling said incoming signal;
   means for developing discontinuous records of said sampled signal, said discontinuity resulting from missed samples;
   means for generating periodic reference signals with variable starting phases dependent on the number of missed samples between adjacent discontinuous records, each of said reference signals being at a different predetermined reference frequency; and,
   means for cross correlating the signals represented by said discontinuous records with said reference signals, and for accumulating the results, thereby to produce signals having amplitudes proportional to the strength of said incoming signal at each of said reference frequencies.

2. The apparatus of claim 1 wherein said means for developing discontinuous records includes rotating drum storage means and means for writing said sampled incoming signal onto said drum storage means in sectors, the number of samples in each sector varying with variations in the rotational speed of said drum, and wherein said generating means includes means for counting the number of samples in a sector and subtracting a predetermined fixed number therefrom in order to obtain said number of missed samples.

3. The apparatus of claim 2 wherein said generating means further includes phase calculating means including means for ascertaining the total amount of previous record processed and the total previous number of missed samples, said starting phase being dependent on both quantities.

4. Apparatus for generating the spectra of an incoming signal comprising:
   means for digitally sampling said incoming signal;
   means for developing discontinuous records of said sampled signal; and
   means for processing said discontinuous sample records so as to obtain signals having amplitudes proportional to the strength of said incoming signal at a number of different reference frequencies, said processing means including means for generating reference signals having phase adjusted starting phases and means for multiplying said discontinuous records by said phase adjusted reference signals.

5. The apparatus of claim 4 wherein said discontinuous record developing means includes a rotating drum storage.

6. The apparatus of claim 4 wherein said processing means includes means for determining the number of missed samples between adjacent records, means for generating reference signals at different frequencies and means for adjusting the starting.phase of said reference signals in accordance with numbers of missed samples.

7. The apparatus of claim 6 wherein said processing means includes means for cross correlating the signals represented by the samples in said records with said reference signals and for accumulating the results.

8. The apparatus of claim 7 wherein said phase adjusting means includes a tapped delay line.

9. The apparatus of claim 7 wherein said means for adjusting said starting phase includes means for calculating:

Starting phase=$\phi_{1,\,k+1}=\phi_{i-1,\,k+1}+\Delta\phi_{k+1}$ where $\phi_{i-1,\,k+1}$=ending phase of k+1 record at frequency i−1
$\Delta\phi_{k+1}=(kN+H_k)\Delta\alpha$
$\Delta\alpha$=change in frequency of reference signal
k=record number
N=number of samples in each record processed
$h_j$=missed sample count between adjacent records $$H_k = \sum_{j=1}^{j=k} h_j$$

10. The apparatus of claim 4 wherein said processing means includes means for generating a number of reference signals each at a different frequency means for cross correlating the signals represented by the samples in said records with said reference signals and means for accumulating the results.

11. A digital spectrum analyzer utilizing discontinuous signal records comprising:
   means for filtering an incoming analog signal;
   means for converting the filtered analog signal to a digital signal at a sampling rate $F_s$;
   a rotating magnetic drum storage;
   means for writing said digital signal onto said drum in sectors and for reading out the information carried in said sectors in terms of discontinuous records of digital samples;
   buffer means for temporarily storing the information read out of said sectors;
   a pair of correlators with one input thereof coupled to the output of said buffer means;

means for generating a series of reference signals at different frequencies and with variable starting phases, said generating means providing two output signals, one at $f_i+\phi$ and the other at $f_i+\phi+90°$, where $f_i$ is the reference frequency and $\phi$ is the desired starting phase;

means for coupling $f_i+\phi$ to the other input of the first of said correlators and $f_i+\phi+90°$ to the other input of the other of said correlators;

means for storing and accumulating the outputs of said correlators in a predetermined order and sequence dependent on $f_i$ and the particular sector of information read out from said drum storage through said buffer means;

means for detecting the square root of the sum of the square of the outputs from said storing and accumulating means to produce a signal having a level representing the amplitude of said incoming signal at a predetermined frequency;

means for displaying said level and predetermined frequency;

means for stepping $f_i$ from $f_l$ to $f_n$ in a predetermined manner;

means for counting the unprocessed samples between the discontinuous records; and, means for adjusting the starting phase of a reference signal generated by said generating means in accordance with the unprocessed sample count, $f_i$, $F_s$, and the record number to establish phase coherence with the reference signal and the signal represented by the record.

12. Apparatus for generating the spectra of an incoming signal comprising:

means for digitally sampling said incoming signal;

means for developing discontinuous records of said sampled signals;

means for generating periodic reference signals which are phase coherent with the discontinuous records with which they are to be correlated; and, means for cross correlating the signals represented by said discontinuous records with said reference signals, and for integrating the results, thereby to produce signals having amplitudes proportional to the strength of said incoming signal at each of said reference frequencies.

13. The apparatus of claim 12 wherein said means for developing discontinuous records includes rotating drum storage means and means for writing said sampled incoming signal onto said drum storage means in sectors the number of samples in each sector varying with variations in the rotational speed of said drum, and wherein said generating means includes means for varying the starting phase of each of said reference signals in accordance with the number of missed samples between adjacent discontinuous records, and means for counting the number of samples in a section and subtracting a predetermined fixed number therefrom in order to obtain said number of missed samples.

14. The apparatus of claim 13 wherein said means for varying the starting phase includes means for ascertaining the total amount of previous record processed and the total previous number of missed samples, said starting phase being dependent on both quantities.

15. The apparatus of claim 13 wherein said means for adjusting said starting phase includes means for calculating:

Starting phase=$\phi_{1,\ k+1}=\phi_{i-1,\ k+1}+\Delta\phi_{k+1}$ where $\phi_{i-1,\ k+1}$=ending phase of k+1 record at frequency i−1
$\Delta\phi_{k+1}=(kN+H_k)\Delta\alpha$
$\Delta\alpha$=change in frequency of reference signal
k=record number
N=number of samples in each record processed
$h_j$=missed sample count between adjacent records $$H_k = \sum_{j=1}^{j=k} h_j$$

* * * * *